(12) United States Patent
Bajt et al.

(10) Patent No.: US 6,228,512 B1
(45) Date of Patent: May 8, 2001

(54) MORU/BE MULTILAYERS FOR EXTREME ULTRAVIOLET APPLICATIONS

(75) Inventors: Sasa C. Bajt, Livermore; Mark A. Wall, Stockton, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/320,061

(22) Filed: May 26, 1999

(51) Int. Cl.$^7$ ................................................ B32B 15/00
(52) U.S. Cl. .................... 428/635; 428/627; 428/634; 428/641; 428/649; 428/633; 428/663
(58) Field of Search .................... 428/627, 632, 428/633, 635, 634, 641, 649, 663, 670; 430/5; 378/35

(56) References Cited

U.S. PATENT DOCUMENTS

| | | | |
|---|---|---|---|
| 5,199,055 | 3/1993 | Noguchi et al. | 378/35 |
| 5,399,448 | 3/1995 | Nagata et al. | 430/5 |
| 5,572,564 | 11/1996 | Murakami | 378/35 |
| 5,958,629 | 9/1999 | Yan et al. | 430/5 |
| 6,013,399 | 1/2000 | Nguyen | 430/5 |

FOREIGN PATENT DOCUMENTS 01094300    12/1989 (JP) .

OTHER PUBLICATIONS

Mandeep, Singh, et al., "Design of Multilayer Extreme–Ultraviolet Mirrors for Enhanced Reflectivity," Applied OPtics, vol. 39, No. 13, 1 May 2000, XP–002145180

Bajt, Sasa, "Molybdenum–Ruthenium/Beryllium Multilayer Coatings," Journal of Vacuum Science & Tech., vol. 18, No. 2, Mar/Apr 2000, XP–00900490

Mirkarimi, P.B., et al., "Advances in the Reduction and Compensation of Film Stress in High–Refectance Multilayer Coatings for Extreme Ultraviolet Lithography," SPIE, vol. 3331,23–25 Feb. 1998, XP–000900531

Skulina, K.M., et al., "Molybdenum/Beryllium Multilayer Mirrors for Normal Incidence in the Extreme Ultraviolet," Applied Optics, vol. 34, No. 19, 1 July 1995, XP–000537295

Stearns, D.G., et al., "Beryllium–Based Multilayer Structures,"Mat. Res. Soc. Symp. Proc. (17–20 Apr. 1995), vol. 382, XP–000900472

Primary Examiner—Timothy M. Speer
Assistant Examiner—Bryant Young
(74) Attorney, Agent, or Firm—L. E. Carnahan; Alan H. Thompson

(57) ABSTRACT

High reflectance, low intrinsic roughness and low stress multilayer systems for extreme ultraviolet (EUV) lithography comprise amorphous layers MoRu and crystalline Be layers. Reflectance greater than 70% has been demonstrated for MoRu/Be multilayers with 50 bilayer pairs. Optical throughput of MoRu/Be multilayers can be 30–40% higher than that of Mo/Be multilayer coatings. The throughput can be improved using a diffusion barrier to make sharper interfaces. A capping layer on the top surface of the multilayer improves the long-term reflectance and EUV radiation stability of the multilayer by forming a very thin native oxide that is water resistant.

19 Claims, 5 Drawing Sheets

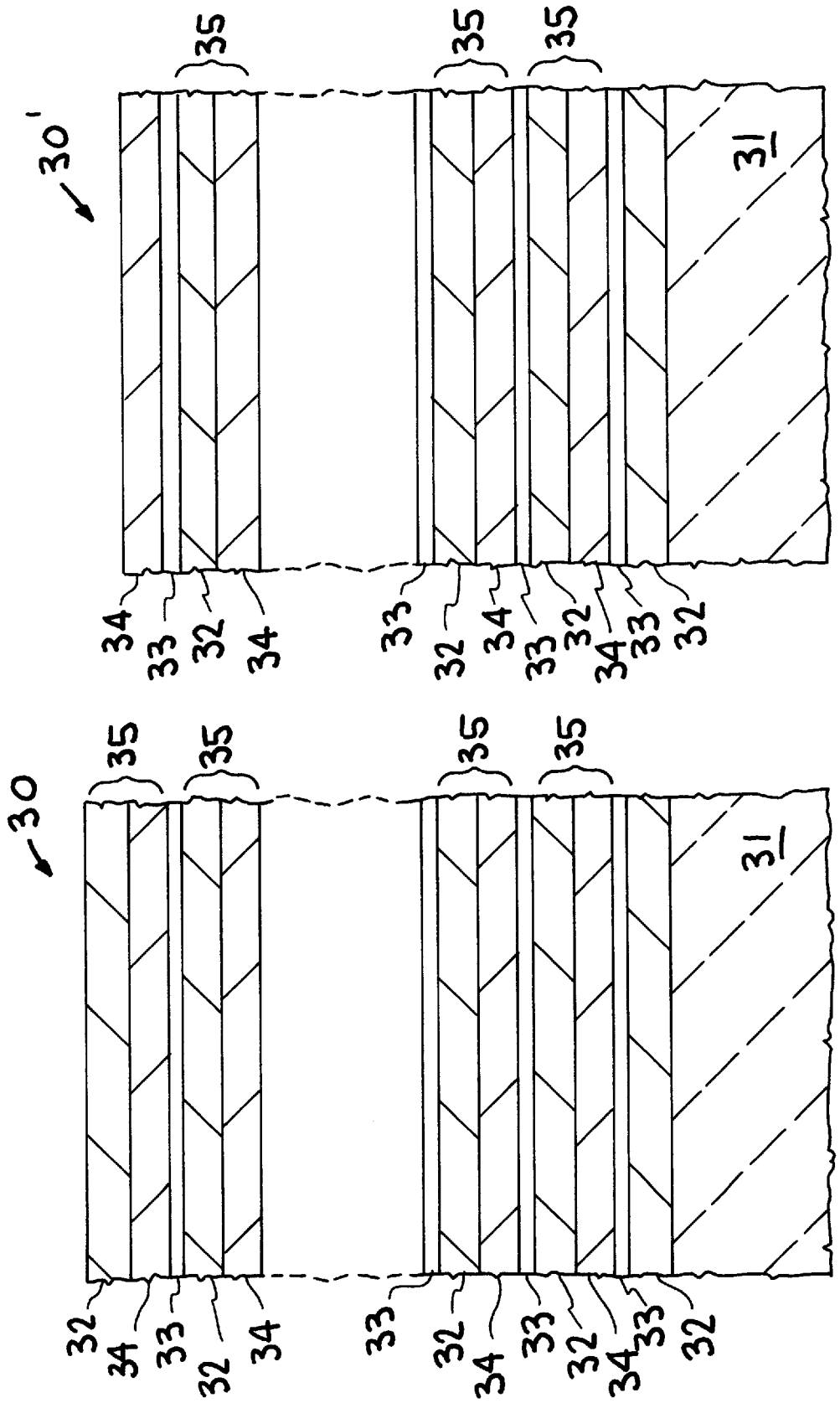

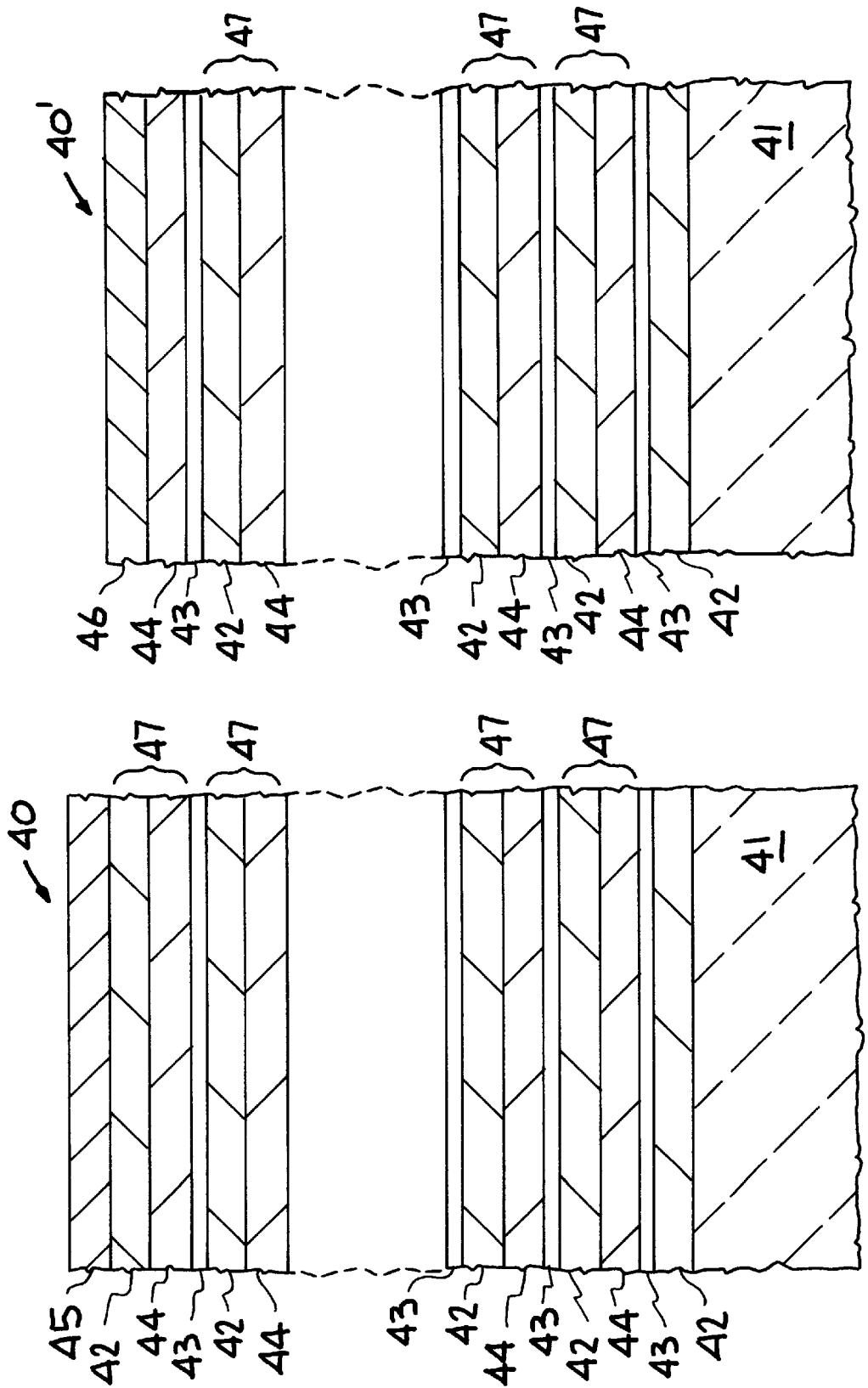

MORU/BE MULTILAYERS FOR EXTREME ULTRAVIOLET APPLICATIONS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to multilayer mirrors, particularly to beryllium based multilayers for extreme ultraviolet (EUV) lithography optics, and more particularly to a high reflectance, low intrinsic roughness and low stress multilayer composed of MoRu/Be, which may include a diffusion barrier on the interfaces and/or a capping layer.

2. Background

Beryllium (Be) based multilayers reflect at wavelengths above 11.1 nm. At these wavelengths, the spectral match with a laser-plasma EUV source improves the optical throughput by a factor of five, as compared to the currently used Mo/Si wavelength (13.4 nm). Higher throughput is crucial for commercial success of EUV lithography because it reduces the costs.

Molybdenum/beryllium (Mo/Be) multilayers have been studied as potential candidates for EUV applications, as discussed in Skulina et al., "Molybdenum/beryllium multilayer mirrors for normal incidence in the extreme ultraviolet," *Appl. Opt.* 34:327–3730 (1995); and Stearns et al., "Beryllium-based multilayer structures," *Mat. Res. Soc. Symp. Proc.*, Vol. 382, 1995 Materials Research Society. A 70% reflectance using Mo/Be coatings with 70 periods (bilayer pairs) at 11.3 nm and 0.28 nm peak width has been demonstrated. Even though Mo/Be multilayers have higher reflectance than Mo/Si multilayers, they have a disadvantage: the effect of a rough (>0.2 nm RMS) substrate on their reflectance. A rougher substrate induces a substantial increase in the roughness of the Mo/Be multilayer. See D. G. Stearns, "Intrinsic defects in multilayer coatings: A statistical analysis," (1998). The reason for this is the crystallinity of both Mo and Be layers. Because both layers are crystalline, there is no mechanism to heal imperfections on the substrate or defects occurring during the growth of the multilayer. This leads to a much higher intrinsic roughness in Mo/Be multilayers as compared to Mo/Si multilayers.

Also, a typical Mo/Be multilayer consists of 70 bilayers (or periods). A peak width is dependent on the number of bilayers and on the optical properties of the two materials in the multilayer. A smaller number of bilayers is preferable because the peak width is then larger. For example, a typical Mo/Si multilayer coating consists of only 40 bilayers and therefore the peak width is about 0.5 nm. The peak width of a 70 bilayer Mo/Be coating is 0.28 nm. Thus, there is a need for a high reflectance, low intrinsic roughness and low stress multilayer system for EUV lithography optics which has a low number of bilayers and a high peak width.

The present invention addresses this problem by providing a multilayer system with a reflectivity of above 70% and a peak width 0.35 to 0.45 nm with 50 bilayers. The multilayer system of this invention is composed of amorphous layers of an alloy composed of molybdenum and ruthenium, and crystalline beryllium layers, thus resulting in a multilayer of molybdenum ruthenium/beryllium (MoRu/Be), with an ideal theoretical peak width of 0.45 nm and reflectivity of over 75%. The period (bilayer) thickness is typically 5.85 nm and the multilayer reflects at 11.4 nm. This multilayer is much thinner than the 70 bilayer Mo/Be and is of comparable thickness to 40 bilayer Mo/Si multilayer. Therefore, the image quality due to thickness uniformity will be comparable to Mo/Si multilayer optics. The MoRu/Be multilayer system has a very low intrinsic stress (21 MPa tensile stress for a 50-bilayer system). To increase the peak width and improve the throughput, a diffusion barrier can be added to make the interfaces sharper. Also, a capping layer can be utilized to improve the long term reflectance stability of the multilayer.

SUMMARY OF THE INVENTION

It is an object of the present invention to provide an improved multilayer system for EUV lithography.

A further object of the invention is to provide a high reflective, low intrinsic roughness and low stress multilayer system for EUV lithography optics.

A further object of the invention is to provide a multilayer system which includes amorphous layers of MoRu and crystalline Be layers.

A further object of the invention is to provide a multilayer system having a reflectance of above 70% which reflects at 11.4 nm, with a peak width in the 0.35–0.45 nm range.

Another object of the invention is to provide low intrinsic roughness, high reflectance MoRu/Be multilayer mirrors for EUV lithography, which has a higher throughput than a Mo/Be multilayer system.

Another object of the invention is to provide a MoRu/Be multilayer with a diffusion barrier on the Be—MoRu interface to sharpen the interfaces and to increase the throughput.

Another object of the invention is to provide a MoRu/Be multilayer with a capping layer to improve long term reflectance stability of the multilayer.

Another object of the invention is to provide a MoRu/Be multilayer system having about 50 bilayers with a peak width of up to 0.45 nm.

Other objects and advantages of the present invention will become apparent from the following description and accompanying drawings. Basically, the present invention involves low intrinsic roughness, low stress, and high reflectance MoRu/Be multilayer mirrors for EUV lithography. The multilayer comprises amorphous layers of an alloy composed of molybdenum and ruthenium, and crystalline layers of beryllium. A MoRu/Be multilayer system with 50 bilayers has a very low, tensile stress. A tensile stress of only 21 MPa has been measured. An amorphous silicon layer may be used as a first layer in the multilayer stack to smooth the substrate.

Also, a diffusion barrier layer made of a low Z material such as carbon or carbides (e.g., $Be_2C$ or $B_4C$) may be used at the MoRu/Be interfaces of the stack to provide higher reflectance and larger peak width for improving the optical throughput, which can be potentially 30–40% higher than the Mo/Be multilayer coatings. In addition, a thin capping layer of $ZrO_2$, $SiO_2$ (4 nm) or ZnO (0.6 nm) may be utilized to improve the long term reflectance stability of the multilayer. These capping materials form native oxides and are water resistant, an important property for the EUV system where residual water vapor is anticipated. The capping layer materials must have optical transparency at EUV wavelengths. The optimum number of bilayers in the MoRu/Be multilayer is 50, with a typical period (bilayer) thickness of 5.85 nm. The maximum peak reflectivity wavelength is 11.4 nm, with a peak width of 0.35 to 0.45 nm.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 5 illustrates a MoRu/Be multilayer with carbon diffusion layers intermediate the MoRu and Be layers.

FIG. 6 illustrates a multilayer similar to FIG. 5, but with a Be top layer.

FIG. 7 illustrates a multilayer similar to FIG. 5 with an $SiO_2$ capping layer.

FIG. 8 illustrates a multilayer similar to FIG. 6 with a ZnO capping layer.

DETAILED DESCRIPTION OF THE INVENTION

The present invention is directed to a high reflectance, low intrinsic roughness and low stress multilayer system composed of amorphous layers of molybdenum (Mo) and ruthenium (Ru) and crystalline layers of beryllium (Be). The multilayer is composed for example, of 50 periods (bilayers) with each period thickness being typically 5.85 nm, with alternating 2.45 nm thick layers of MoRu and 3.40 nm thick layers of Be. The multilayer reflects above the Be K-edge (11.1 nm) with a reflectance above 70%, and has a peak width of 0.35–0.45 nm. The throughput of the MoRu/Be multilayer of this invention has a potential of 30–40% higher throughput than a Mo/Be multilayer coating.

The first layer of the multilayer stack may be either amorphous MoRu or amorphous Si. Also, a diffusion barrier or layer of low Z materials such as carbon or carbides (e.g., $B_4C$, $Be_2C$) having a thickness of 0.2–0.3 nm, may be utilized to sharpen the interface between the MoRu and the Be layers to provide high reflectance and larger peak width for improved throughput. In addition, a capping layer of $SiO_2$, $Zr_2O$, or ZnO on the top surface of the multilayer will improve the long term reflectance stability thereof. These capping materials are transparent at EUV wavelengths, and are water resistant, an important property for the EUV system where residual water vapor is anticipated.

Figure 1:
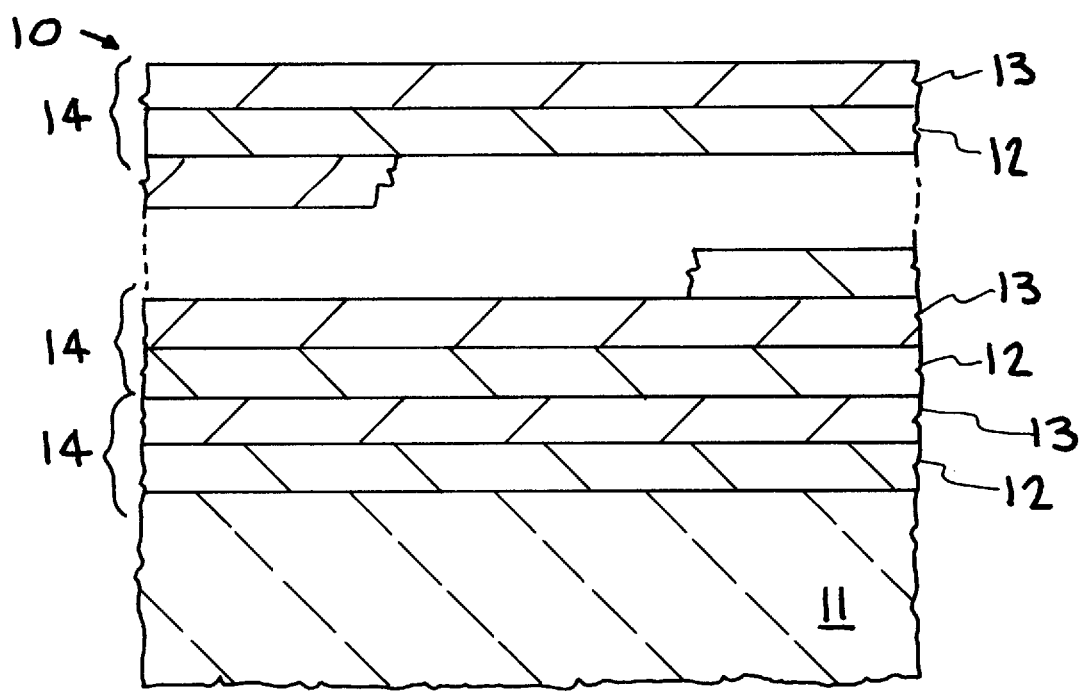
FIG. 1 illustrates a partial MoRu/Be multilayer with a Be top layer.
Figure 2:
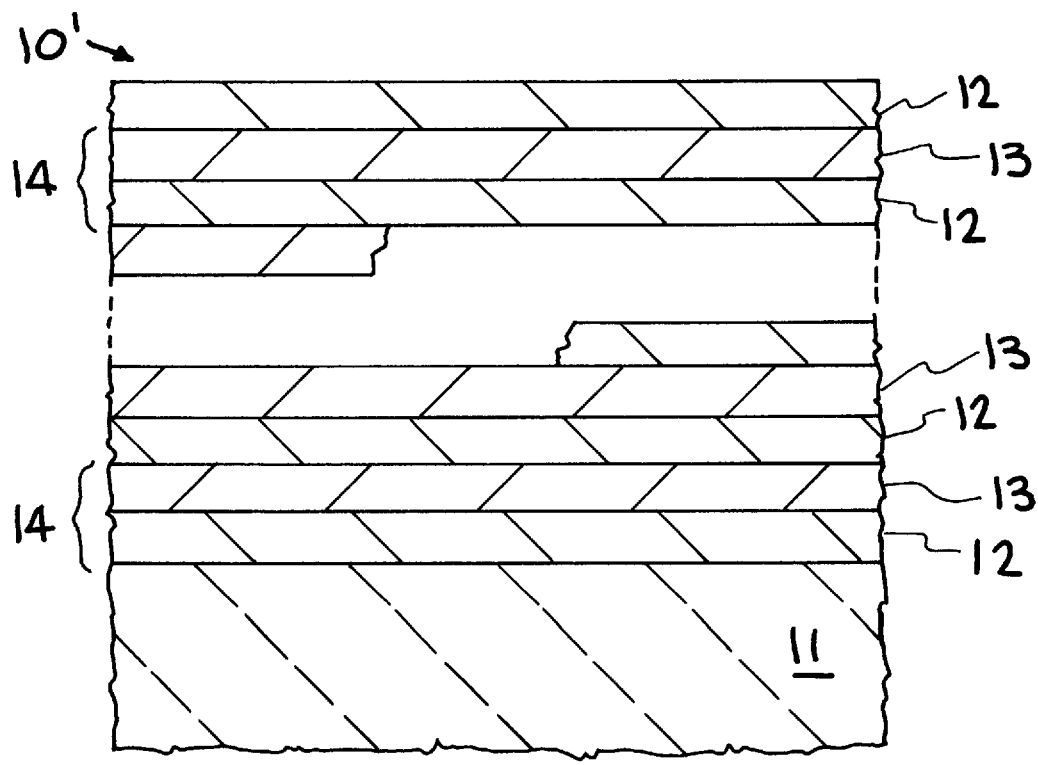
FIG. 2 illustrates a partial MoRu/Be multilayer with a MoRu top layer.

FIGS. 1–8 illustrate greatly enlarged partial cross-sectional views of embodiments of the MoRu/Be multilayer system of the present invention. FIGS. 1 and 2 illustrate a multilayer structure composed as a substrate/MoRu/Be/MoRu/Be/MoRu . . . , with the difference being in the composition of the top layer, either Be or MoRu. The MoRu is an alloy composed of 30 to 70% Mo and 70 to 30% Ru, and in one composition the weight ratio of Mo:Ru was 0.42:0.58.

As shown in FIG. 1, the multilayer structure generally indicated at 10 comprises a substrate 11, which may be composed of silicon, Zerodur, ULE (ultra low expansion glass) or fused silica, and alternating amorphous MoRu layers 12 and crystalline Be layers 13, with a Be layer 13 on the top. The adjacent MoRu and Be layers 12 and 13 define bilayers 14, and as pointed out above, the optimum number of bilayers for the MoRu/Be multilayer 10 is 50.

FIG. 2 illustrates an embodiment of a multilayer structure 10' similar to FIG. 1 except that the top layer is an MoRu layer 12. As described above, the bilayers 14 of FIGS. 1 and 2 may have a thickness, for example, of 5.85 nm, with MoRu layers 12 being 2.45 nm thick and the Be layers 13 being 3.40 nm thick. While the top layer of the multilayer stack may be either Be or MoRu, a Be top layer is preferred because Be forms a thick BeO layer (4 nm), which is relatively stable as compared to MoRu oxides.

Figure 3:
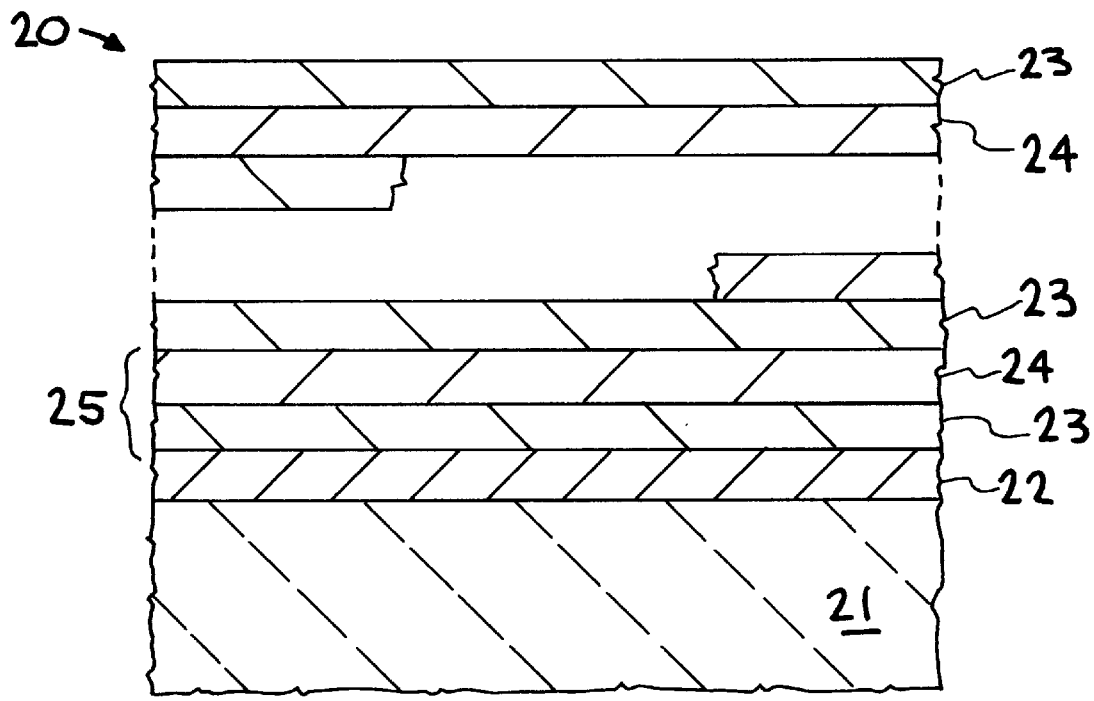
FIG. 3 illustrates a MoRu/Be multilayer with an amorphous silicon (a-Si) layer between the substrate and the first MoRu layer.
Figure 4:
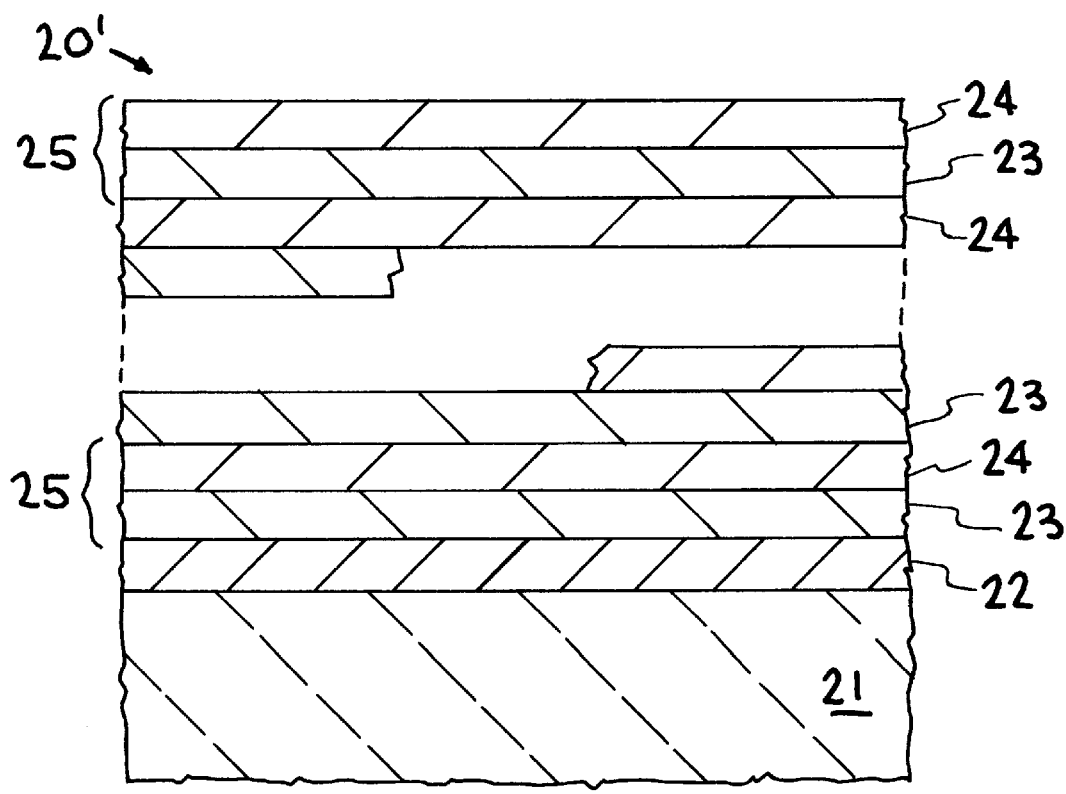
FIG. 4 illustrates a multilayer similar to FIG. 3, but with a Be top layer.

Another option of the multilayer structure is illustrated in FIGS. 3 and 4, wherein a layer of amorphous silicon (a-Si) is interposed between the substrate and the first layer of amorphous MoRu, and thus the multilayer structure comprises a substrate /a-Si/MoRu/Be/MoRu/Be/MoRu . . . structure.

As shown in FIGS. 3 and 4, the multilayer structure generally indicated at 20 and 20' comprises a substrate 21, a layer 22 of a-Si having a thickness of 2 to 10 nm, followed by alternating layers 23 of MoRu and layers 24 of Be, with FIG. 3 having a top MoRu layer 23 and FIG. 4 having a top Be layer 24. As in FIGS. 1 and 2, the adjacent MoRu/Be layers 23 and 24 define bilayers 25, as described above, with the multilayer structures having, for example, 50 bilayers. The a-Si layer 22 serves to smooth the substrate.

The present invention uses a MoRu alloy as a thin film or layer in the multilayer coating. Only phase diagrams of MoRu as a bulk material exist in the literature. See Kleykamp et al., "The constitution of the Mo-Ru system," *J. of Less Common Metals*, 136:271–275 (1998). The phase diagram of the bulk material shows that Mo and Ru form only one stable phase—$Mo_5Ru_3$. Since elemental Mo and Ru have different crystalline structures, an alloy of the two materials should be amorphous. However, bulk material properties are often significantly different from thin film properties of the same material. In the present invention, the MoRu layers are only 3.40 nm thick, corresponding to about ten atomic layers. Therefore, thin films of MoRu were made having different Mo:Ru weight ratios and the crystalline structure analyzed using Rutherford backscattering. It was found that MoRu layers made having Mo:Ru weight ratios of 0.42:0.58 as well as 0.625:0.375 (i.e., $Mo_5Ru_3$) were amorphous. Thus, MoRu can form an amorphous thin layer for a large range of Mo:Ru compositions.

Figure 9:
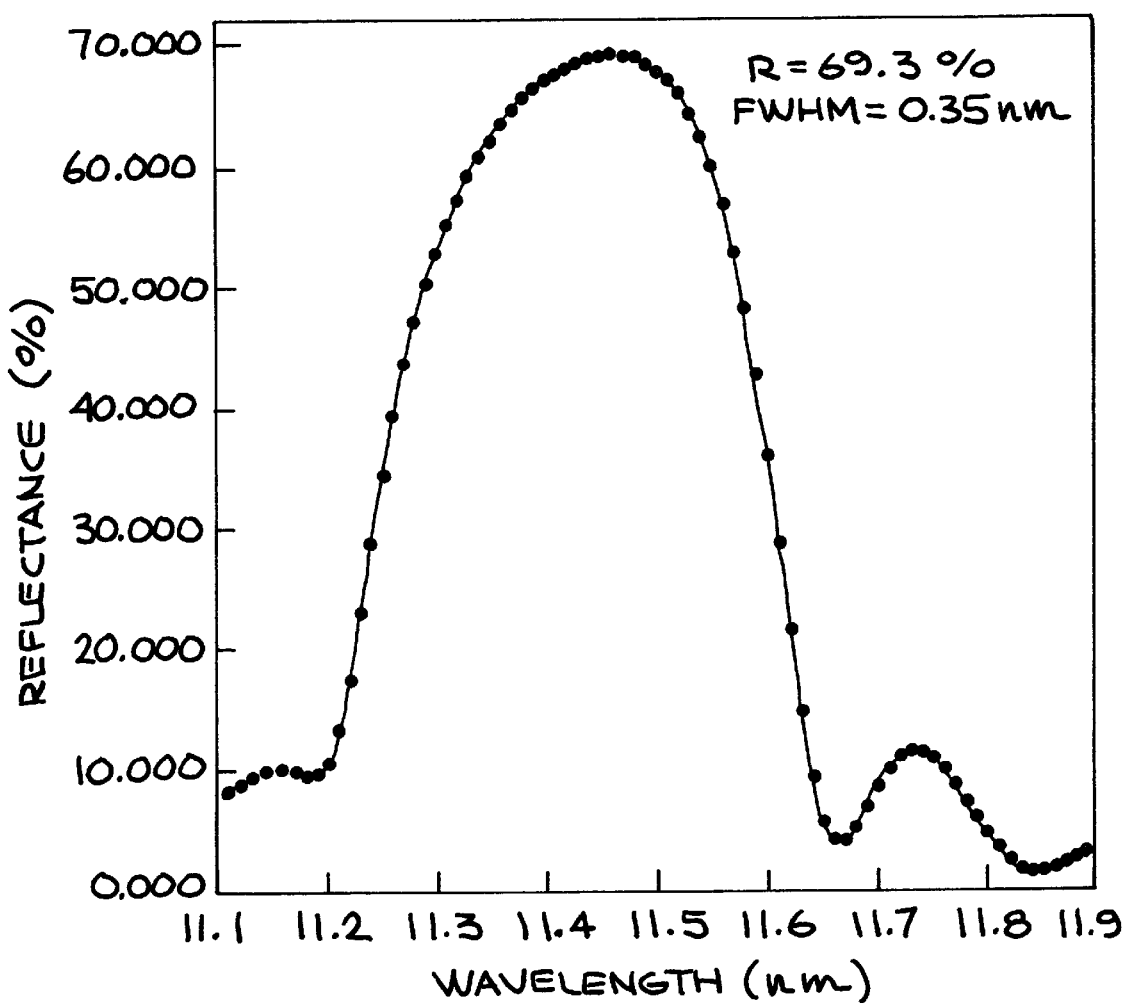
FIG. 9 graphically illustrates the reflectance of an MoRu/Be multilayer optimized to reflect above the Be K-edge (11.1 nm).

The MoRu/Be multilayer coating with 50 periods (bilayers), such as shown in FIGS. 1 and 2, was optimized to reflect above the Be K-edge (11.1 nm). A peak reflectance of 69.3% with a centroid position at 11.43 nm and a bandwidth of 0.35 nm was achieved, and is graphically illustrated in FIG. 9. A peak reflectance above 70% for the same number of periods (50) has also been demonstrated. The coatings were deposited with alternating 2.45 nm thick layers of MoRu alloy and 3.40 nm thick layers of Be. The MoRu and Be layers were formed by magnetron sputter film deposition on Si (100) polished 4 inch wafers.

MoRu/Be multilayer coatings have at least four major improvements as compared to Mo/Be and Mo/Si multilayers.

1. High reflectance. Theoretically one can achieve 75.4% reflectance for a perfect MoRu/Be coating with 50 bilayers. Such a coating would have a period thickness of 5.84 nm and would reflect at 11.44 nm with a peak width of 0.45 nm. In comparison, an ideal Mo/Be coating with the same period thickness and the same number of bilayers would have a reflectance of 73.7% with a peak width of 0.39 nm. The throughput of an optical system that consists of seven reflective optics is proportional to:

optical throughput≈$I_{source} \bullet o_{ML} \bullet R^7_{ML}$, where $I_{source=intensity\ of\ the\ source}$, $o_{ML}$ =peak width, and $R_{ML}$ =reflectance. The throughput for an ideal MoRu/Be multilayer is more than 26% higher than the throughput for an ideal Mo/Be coating, assuming that the intensity of the source is the same for both multilayers.

2. Larger peak width (0.35 nm for MoRu/Be vs. 0.28 nm for Mo/Be). Peak width is an important parameter in calculating the throughput. For example, comparing the throughput of the MoRu/Be (reflectance of 69.3%, peak width of 0.35 nm) one concludes that an average MoRu/Be has 14% higher throughput than a Mo/Be multilayer. In addition, a large peak width relaxes the coating specification to match a series of optical coatings in the same EUV system because of the larger overlap and makes the alignment process easier.

3. A smaller number of bilayers (50 for MoRu/Be vs. 70 for Mo/Be). Fewer bilayers mean thinner coatings, and therefore smaller stress and figure error on the optical substrates. The measured stress is tensile and about 21 MPa, which is about 15 times smaller than a typical Mo/Be multilayer (>300 MPa).

4. Smaller intrinsic roughness due to the amorphous MoRu layer. Experimental results indicate that if the substrate roughness is 0.28 nm or higher, then the MoRu/Be multilayer does not contribute any additional roughness. In fact, above 0.28 nm RMS roughness, MoRu/Be can actually reduce surface roughness. This same effect occurs for Mo/Si multilayers, whereas Mo/Be multilayers always add roughness to the surface.

The multilayer pair of this invention consists of amorphous MoRu alloy layers and crystalline Be layers. To verify the crystallinity of the MoRu and Be layers, a series of measurements were performed. First, an x-ray diffraction measurement (θ-2θ) was taken from 30 to 50 degrees on a typical MoRu/Be multilayer. In addition, electron small angle diffraction measurements were made, showing that beryllium layers were polycrystalline. It was concluded that the MoRu alloy layers are amorphous, as no diffraction peaks, rings, or dots were observed that correspond to crystalline Mo or Ru.

The amorphous layer of MoRu has a smoothing effect on the interfaces. Interdiffusion of Be and MoRu on the interfaces is the cause of lower than ideal reflectance and smaller peak width. The thickness of interdiffusion layers is interface dependent. For example, the interdiffusion thickness of MoRu-on-Be is larger than the interdiffusion thickness of Be-on-MoRu. By making these interfaces sharper, one can increase the reflectance of MoRu/Be coatings. This is accomplished by inserting an extremely thin diffusion barrier or layer on the order of 0.2–0.3 nm intermediate the MoRu and Be layers. One potential candidate is a carbon layer or carbide layer, such as boron carbide or beryllium carbide. Sputtering carbon on one interface, specifically the interface that lies on the field of intensity maximum, should be sufficient. In the MoRu/Be system, the sensitive interface is Be-on-MoRu. To improve the sharpness of the interfaces, the following multilayer structure is: substrate/MoRu/diffusion barrier/Be/MoRu/diffusion barrier/Be . . . , and embodiments are illustrated in FIGS. 5 and 6.

As shown in FIGS. 5 and 6, the multilayer embodiments are the same except for the composition of the top layer, being MoRu in FIG. 5, and Be in FIG. 6. As shown, the multilayer structure generally indicated at 30 and 30' comprises a substrate 31, a MoRu layer 32, a carbon (C) layer 33, a Be layer 34, and alternating layers of MoRu, C, Be, with the top layer being a MoRu layer 32. The adjacent Be and MoRu layers form bilayers 35.

The diffusion barrier, composed of carbon or other material, should prevent interdiffusion and therefore increase the reflectance and increase the peak width. The ideal multilayer with no roughness or interdiffusion layers on the interface should have a peak width of about 0.45 nm. A MoRu/Be multilayer with 72% reflectance (0.4 nm peak width) has 42.5% higher throughput than a Mo/Be multilayer. Even if the reflectance of the MoRu/Be multilayer is 70% (0.4 nm peak width), the throughput for MoRu/Be is still 30% higher than for the Mo/Be multilayer.

Another source of lower than ideal reflectivity of the multilayer structure is the oxidation of the top or outer layer. For example, a top layer of Be forms a 4 nm thick BeO layer. Using appropriate material on the surface can reduce surface oxidation and make the multilayer more stable against EUV radiation. Materials that are considered for terminating the multilayer stack as capping layers include $SiO_2$, $Zr_2O$, and ZnO, and two capping layers are illustrated in FIGS. 7 and 8. The capping layers are formed by depositing Si, Zr, or Zn on the top layer of either MoRu or Be. These materials will form native oxides in the presence of air.

Based on EUV radiation stability experiments, $SiO_2$ is a better surface oxidation barrier than BeO. See Wedowski et al., "Lifetime studies of Mo/Si and Mo/Be multilayer coatings form extreme ultraviolet lithography, Soft x-ray Coatings," Aspherics, and Applications, Proceedings of SPIE-Denver (1999). Zinc oxide is advantageous since it has no reaction with water, which is important in EUV systems which have some residual water vapor. See G. V. Samsonov (editor), The Oxide Handbook, IFI/Plenum, New York (1973).

In addition, Zn forms a native oxide which is only 0.5–0.6 nm thick; this is thinner than native $SiO_2$, which is 2–4 nm thick. For example, the reflectance of an ideal MoRu/Be multilayer with no oxide is 75.4%, the reflectance of MoRu/Be with 3 nm of $SiO_2$ as a top layer is 71%, and the reflectance of MoRu/Be with 0.6 nm of ZnO as a top layer is 75.3%. This shows that in the best case, ZnO does not absorb EUV light. Even if one assumes that the top layer consists of 1 nm of Zn and 0.6 nm of ZnO, the reflectance is still 73.5%, much higher (2.5%) than a reflectance of $SiO_2$ capped multilayers.

FIGS. 7 and 8 illustrate capped multilayer structures indicated at 40 and 40' which include the diffusion barrier layer of FIGS. 5 and 6. The difference between FIGS. 7 and 8, in addition to the composition of the capping layer, is the different top or outer layer of the multilayer stack. As shown, the multilayer structures 40 and 40' include a substrate 41, alternating layers of MoRu, C, and Be indicated at 42, 43 and 44 respectively, with the top layer 42 of MoRu having a $SiO_2$ capping layer 45 in FIG. 7, and the top layer 44 of Be having a ZnO capping layer 46 in FIG. 8, with adjacent Be and MoRu layers forming bilayers 47.

It has thus been shown that the present invention provides an MoRu/Be multilayer structure with low intrinsic roughness, low stress and high reflectance for use in mirrors in an EUV lithographic system. The MoRu/Be multilayer has a higher throughput and a larger peak width than a Mo/Be multilayer. Also, the reflectance and peak width can be increased by the use of diffusion barriers or layers which sharpen the interfaces of the bilayers. Also, capping layers may be utilized to improve the long term reflectance stability of the multilayer.

While particular embodiments, materials and parameters have been set forth or illustrated to exemplify and teach the principles of the invention, such are not intended to be limiting. Modifications and changes may become apparent to those skilled in the art, and it is intended that the invention be limited only by the scope of the appended claims.

The invention claimed is:

1. Low intrinsic roughness, low stress and high reflectance MoRu/Be multilayer mirrors for extreme ultraviolet lithography.

2. The multilayer mirrors of claim 1, wherein said MoRu/Be multilayer consists of amorphous layers of MoRu and crystalline Be layers.

3. The multilayer mirrors of claim 1, wherein said MoRu/Be multilayer is composed of 50 bilayer pairs of MoRu and Be.

4. The multilayer mirrors of claim 3, wherein each of said bilayer pairs has a thickness of about 5.85 nm.

5. The multilayer mirror of claim 4, wherein said thickness of said bilayer pairs is composed of about 2.45 nm of MoRu and about 3.40 nm of Be.

6. The multilayer mirrors of claim 1, wherein said MoRu/Be multilayers have a peak width in the range of 0.35 to 0.45 nm.

7. The multilayer mirrors of claim 1, wherein said MoRu/Be multilayers have a reflectance greater than about 69%.

8. The multilayer mirrors of claim 1, wherein said MoRu/Be multilayer additionally includes diffusion barriers on Be-on-MoRu interfaces.

9. The multilayer mirrors of claim 8, wherein said diffusion barriers are composed of material selected from the group consisting of carbon and carbides, and have a thickness of about 0.2–0.3 nm.

10. The multilayer mirrors of claim 1, wherein said MoRu/Be multilayer includes a capping layer selected from the group consisting of oxides of Be, MoRu, Si, Zr, and Zn, and having a thickness of about 0.5 to 4.0 nm.

11. The multilayer mirrors of claim 10, wherein said capping layer is composed of ZnO with a thickness of 0.5–0.6 nm.

12. The multilayer mirrors of claim 1, wherein each comprises a substrate, a MoRu/Be multilayer, and an amorphous silicon layer intermediate said substrate and said MoRu/Be multilayer.

13. A MoRu/Be multilayer on a substrate comprising amorphous layers of an MoRu alloy and crystalline layers of Be.

14. The multilayer of claim 13, additionally including a layer of amorphous silicon that is intermediate the substrate and a first layer of the MoRu/Be multilayer.

15. The multilayer of claim 13, wherein an outer layer is composed of Be or MoRu.

16. The multilayer of claim 13, additionally including a diffusion barrier layer that is intermediate bilayer pairs of MoRu and Be.

17. The multilayer of claim 16, wherein the diffusion barrier layer is selected from the group consisting of carbon and carbides.

18. The multilayer of claim 13, additionally including a capping layer selected from the group consisting of oxides of Si, Zr and Zn.

19. The multilayer of claim 13, comprising of about 50 bilayer pairs of MoRu and Be.

* * * * *